Oct. 12, 1965 J. E. BRIDGES 3,211,946

ELECTROMAGNETIC DEFLECTION CIRCUITS

Filed April 28, 1961

4 Sheets-Sheet 1

Inventor.
Jack E. Bridges.
By Hofgren, Brady, Wegner, Allen & Stellman
Attorneys.

United States Patent Office 3,211,946
Patented Oct. 12, 1965

3,211,946

ELECTROMAGNETIC DEFLECTION CIRCUITS

Jack E. Bridges, Park Ridge, Ill., assignor to Warwick Electronics Inc., a corporation of Delaware Filed Apr. 28, 1961, Ser. No. 106,357
14 Claims. (Cl. 315—27)

The present invention relates to electromagnetic deflection circuits and more particularly to electromagnetic deflection circuits utilizing semiconductors rather than vacuum tubes and capable of operating from a power source of 120 volts D.C. or less.

The present state of the art in the semiconductor field has made it possible to make many electronic devices both more portable and more reliable than was previously possible. In the case of television receivers, a problem arises when semiconductor circuits are considered as a replacement for the presently used vacuum tube deflection circuits. In order to obtain the proper voltage to use transistors in the picture tube deflection circuits, it is necessary to provide a step-down transformer in the power supply which would not be required in utilizing vacuum tubes. The inclusion of power step-down transformers in television sets represents a noticeable increase in their cost of manufacture. Therefore it is particularly desirable to provide the portability and reliability afforded by the use of transistors without increasing the cost of manufacturing television sets.

Therefore, it is an object of the present invention to provide a semiconductor deflection circuit which will operate directly from a 90 to 120 volt D.C. power supply.

Another object is to provide a new and improved electromagnetic deflection circuit.

A further object of the present invention is to provide an electromagnetic deflection circuit wherein the power losses are reduced.

An additional object of the present invention is to provide an electromagnetic deflection circuit wherein the retrace time is reduced to a minimum value while maintaining a sufficiently linear scan.

Still another object is to provide an electromagnetic deflection circuit wherein the retrace is accomplished without rapidly turning off the driving device.

Yet another object is to provide a deflection circuit wherein semiconductors are utilized to produce a rapid retrace action.

Figure 1:
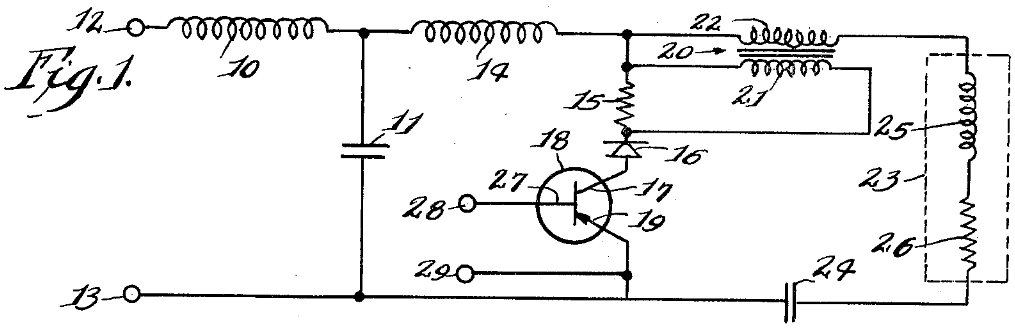
Figures 2A, 2B, 2C, 2D:
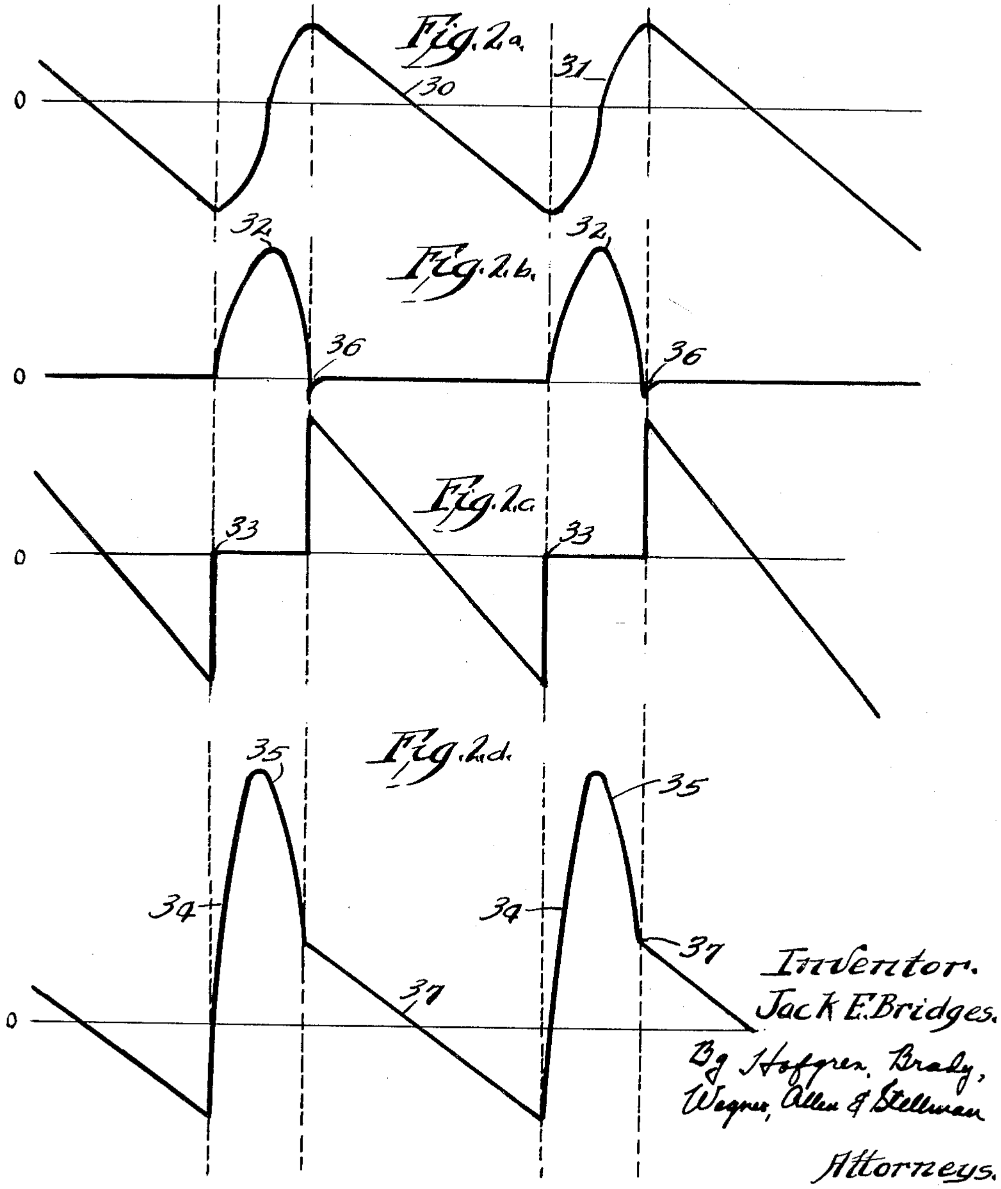
Figure 3:
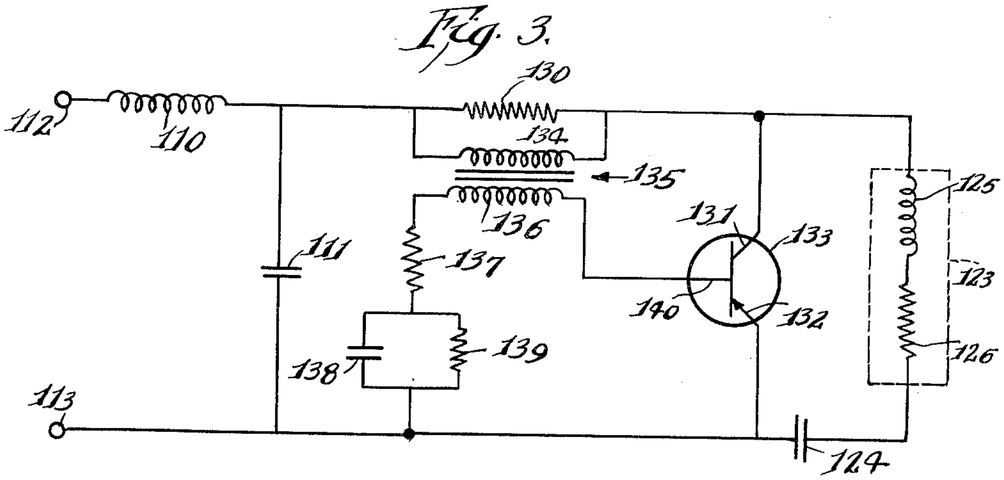
Figures 4A, 4B, 4C:
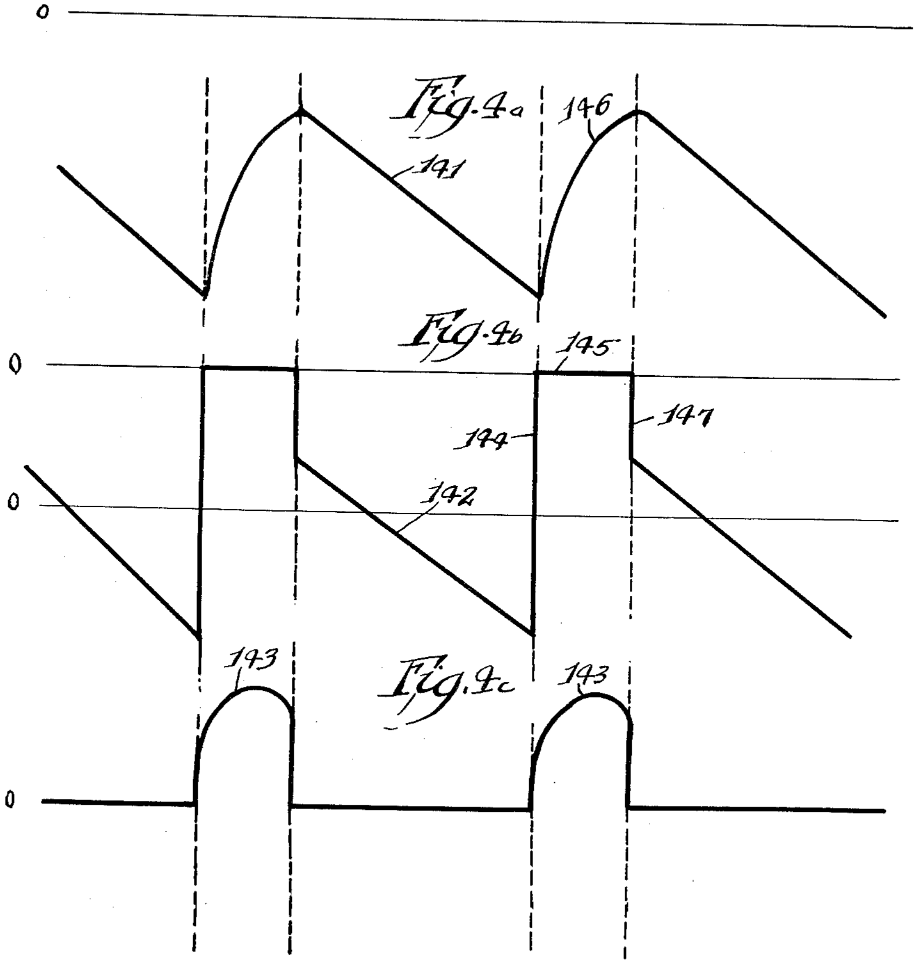
Figures 5, 6A, 6B, 6C, 6D:
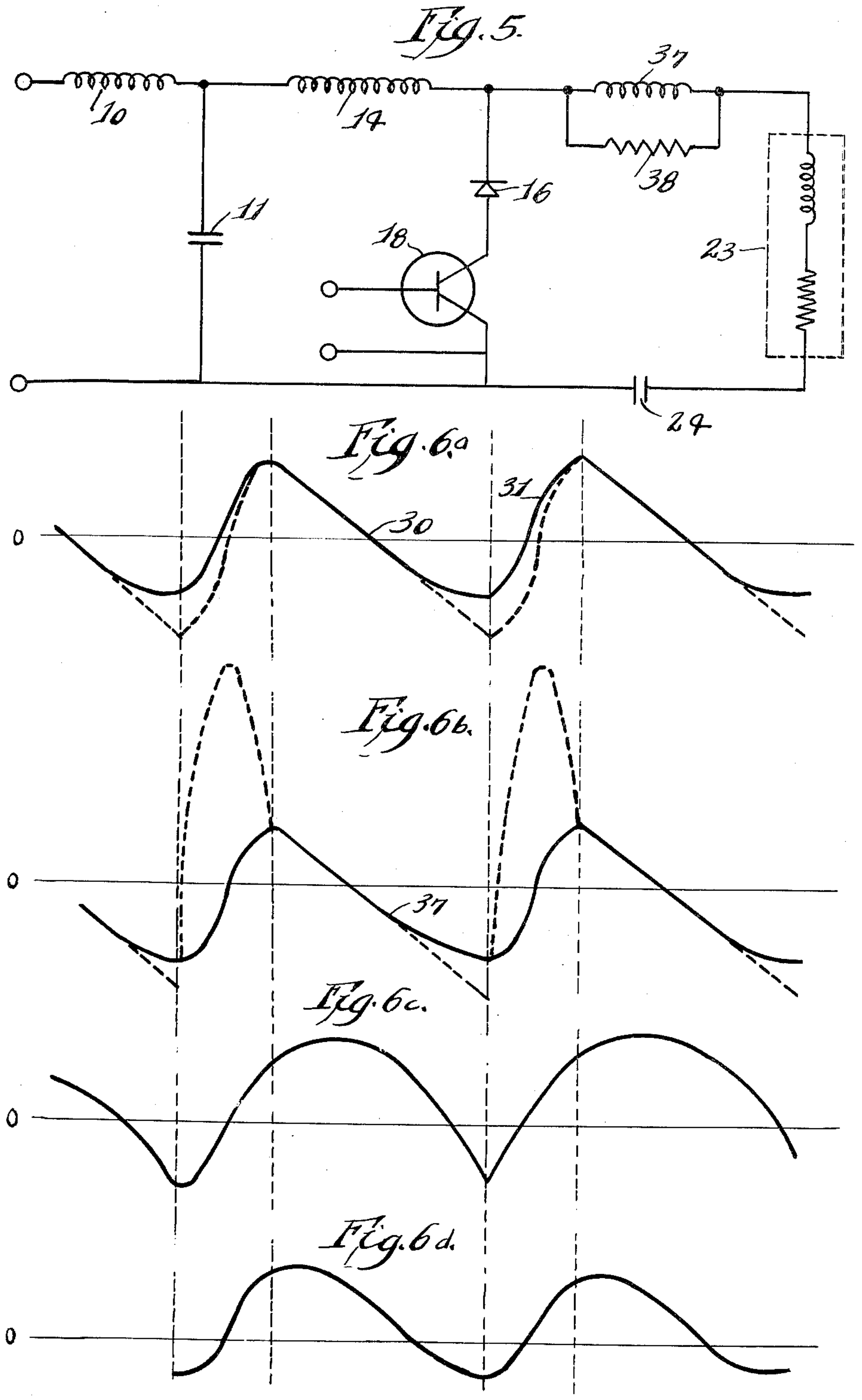
Figure 7:
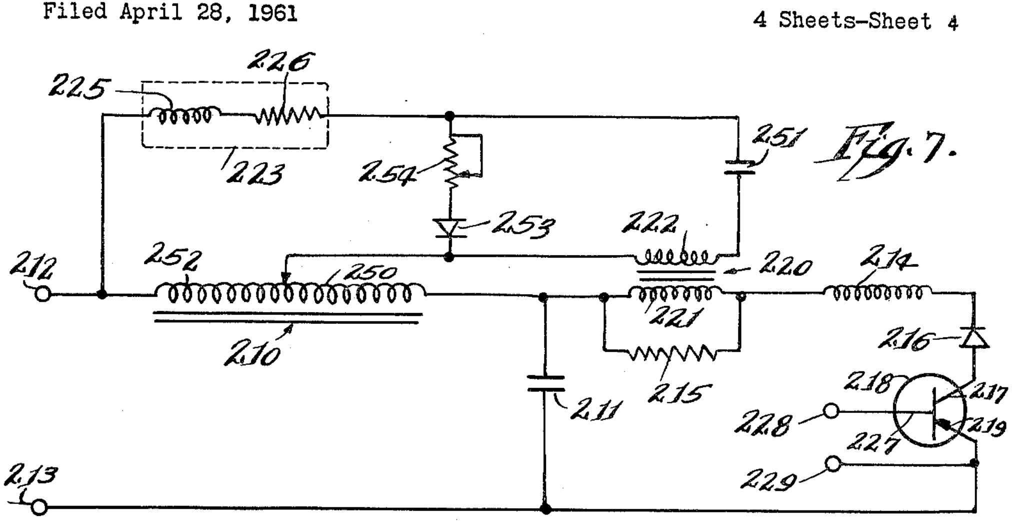
Figures 8A, 8B, 8C, 8D:
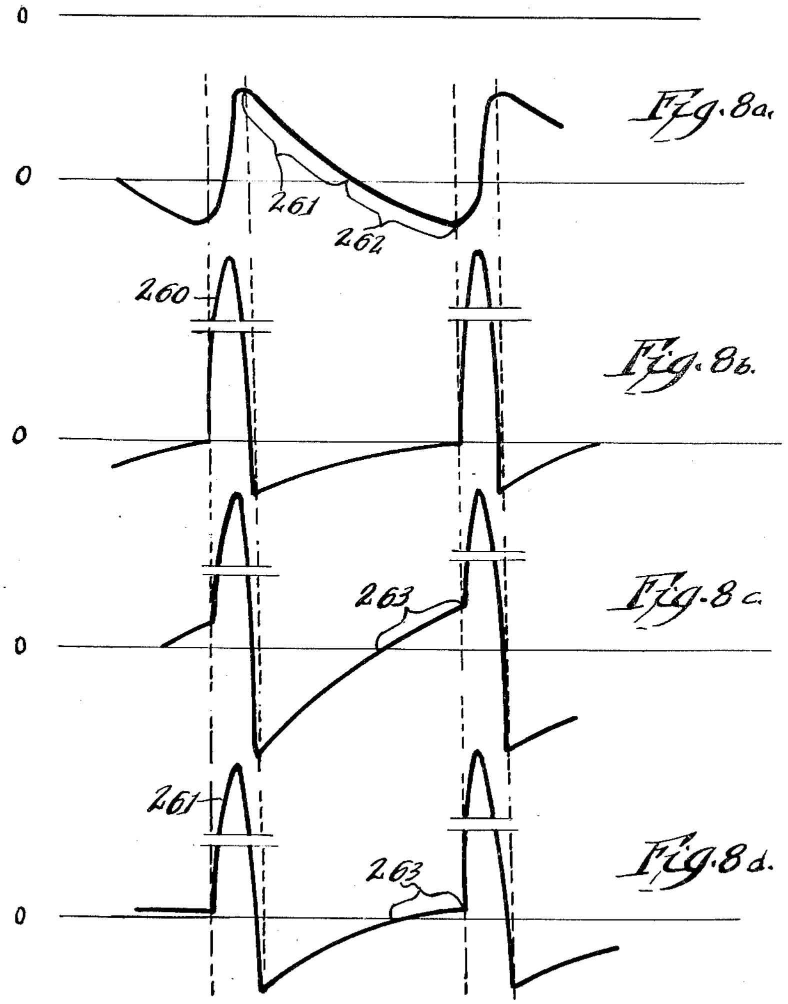

Further objects and advantages will become apparent from the following detailed description taken in connection with the accompanying drawings, in which:

FIGURE 1 is a schematic drawing of one embodiment of the present invention;

FIGURE 2*a* is a plot of the voltage across a condenser shown in a portion of the circuit of FIGURE 1;

FIGURE 2*b* is a plot of the collector current of the transistor shown in a portion of the circuit of FIGURE 1;

FIGURE 2*c* is a plot of the voltage across the transistor and diode shown in a portion of the circuit of FIGURE 1;

FIGURE 2*d* is a plot of the voltage across the deflection coil shown in a portion of the circuit of FIGURE 1;

FIGURE 3 is a schematic drawing of a modified version of the embodiment of the invention shown in FIGURE 1;

FIGURE 4*a* is a plot of the voltage across a condenser shown in a portion of the circuit of FIGURE 3;

FIGURE 4*b* is a plot of the voltage across the deflection coil shown in a portion of the circuit of FIGURE 3;

FIGURE 4*c* is a plot of the collector current of the transistor in a portion of the circuit of FIGURE 3;

FIGURE 5 is a schematic drawing of another modified version of the embodiment of the invention shown in FIGURE 1;

FIGURE 6*a* is a plot of the voltage across a condenser shown in a portion of the circuit of FIGURE 5;

FIGURE 6*b* is a plot of the voltage across the deflection coil shown in a portion of the circuit of FIGURE 5;

FIGURE 6*c* is a plot of an integrated condenser voltage produced by an inductor in a portion of the circuit of FIGURE 5;

FIGURE 6*d* is a plot of a sawtooth deflection current through the deflection coil in a portion of the circuit of FIGURE 5;

FIGURE 7 is a schematic drawing of yet another modified version of the embodiment of the invention shown in FIGURE 1;

FIGURE 8*a* is a plot of the voltage across a secondary coil of an inductor-transformer and a condenser shown in a portion of the circuit of FIGURE 7.

FIGURE 8*b* is a plot of the voltage across a secondary coil of another transformer shown in a portion of the circuit of FIGURE 7;

FIGURE 8*c* is a plot of the voltage across a diode and resistor shown in a portion of the circuit of FIGURE 7 when no linearity correction is applied; and FIGURE 8*d* is a plot of the voltage across the diode and resistor shown in a portion of the circuit of FIGURE 7 when a full linearity correction is applied.

While this invention is susceptible of embodiments in many different forms, there is shown in the drawings and will herein be described in detail several embodiments of the invention with the understanding that the present disclosure is to be considered as an exemplification of the principles of the invention and is not intended to limit the invention to the embodiments illustrated. The scope of the invention will be pointed out in the appended claims.

One embodiment of the present invention is shown in FIGURE 1. An inductor 10 is connected in series with a condenser 11 between the terminals 12 and 13. The terminals 12 and and 13 are connected to a source of 90 to 120 volt electrical potential (not shown). Thus, these elements form an inductance capacitance charging circuit. An inductor 14, a 3.3 ohm resistor 15, a diode 16, a collector 17 of a transistor 18 and an emitter 19 of the transistor 18 are connected in series across the condenser 11. A transformer 20 has a 25 millihenry primary coil 21 connected across the resistor 15. A 450 millihenry second coil 22 of the transformer 20 is connected in series with a magnetic deflection coil 23 and a condenser 24 across the condenser 11 and the inductance 14. Condenser 24 has a capacitance of approximately 300 microfarads. The electromagnetic deflection coil 23 has a 70 millihenry internal inductance 25 and a 30 ohm internal resistance 26. A base 27 of the transistor 18 is connected to a terminal 28. A terminal 29 is connected to the emitter 19 of transistor 18. A source of negative pulses (not shown) is connected across the terminals 28 and 29 to drive the transistor 18.

The embodiment of the invention shown in FIGURE 3 differs from the embodiment shown in FIGURE 1 in that it is self-oscillating and therefore does not require a source of external trigger pulses except for synchronization with other signals. An inductor 110 and a capacitor 111 are connected in series across terminals 112 and 113. Terminals 112 and 113 are connected to a 90 to 120 volt source of electrical potential (not shown). These elements form an inductance capacitance charging circuit similar to the one shown in FIGURE 1. A resistor 130 is connected in series with a collector 131 and an emitter 132 of a transistor 133 across the condenser 111. An electromagnetic deflection coil 123 having an internal inductance 125 and an internal resistance 126 is connected in series with a condenser 124 between the collector 131 and the emitter 132 of the transistor 133. A primary coil 134 of a transformer 135 is connected across the resistor 130. A secondary coil 136 is connected in series with a resistor 137 and a parallel condenser 138 and resistor 139 between a base 140 and the emitter 132 of the transistor 133.

An ideal deflection circuit provides a linear sawtooth waveform having a rise time equal to the desired sweep period and a minimum retrace period. Referring again to FIGURE 1, the voltage source applies a negative voltage across the terminals 12 and 13. This charges the condenser 11 as indicated by the portion 30 of the condenser 11 voltage plot, FIGURE 2*a*. Whenever a negative voltage pulse is impressed across the terminals 28 and 29, the transistor 18 will conduct discharging the condenser 11 through the inductor 14. The voltage discharge during this period of operation is illustrated by the portion 31 of the condenser voltage plot of FIGURE 2*a*.

The charging time of condenser 11 is selected to be in a range between being slightly longer to substantially longer than its discharging time. At the beginning of the discharging time, electrical energy is stored in the condenser 11 and in the inductor 10. Since the inductance of the inductor 10 is very large, the energy stored therein will remain relatively constant and may be considered as a constant during the operation of the other portion of the circuit. When the condenser is negatively charged as shown at the junction of portion 30 to portion 31 in the plot in FIGURE 2*a*, the diode 16 and the transistor 18 are made fully conducting with a relatively low voltage appearing across them by the application of a negative pulse across terminals 28 and 29. FIGURE 2*c* is a plot of the voltage appearing across the diode 16 and the transistor 18. Portion 33 shows this approximately zero voltage appearing across the diode and transistor. The voltage across condenser 11 causes a current to flow through the inductor 14, diode 16 and transistor 18, as shown by portion 32 of FIGURE 2*b*, which is a plot of the transistor 18 collector current. This current builds up sinusoidally at a rate determined by condenser 11 and inductor 14. When the energy contained in condenser 11 has been transferred to inductor 14, this current will attempt to reverse as shown at portion 36 of FIGURE 2*b*.

This reverses the polarity across diode 16 which prevents further flow of current as illustrated in FIGURE 2*b*. After this reverse flow is stopped by diode 16, the transistor 18 is rendered non-conducting by the removal of the negative pulse across terminals 28 and 29. Current flowing through inductor 10 begins to recharge the condenser 11 as shown by portion 30 of FIGURE 2*a*. For stable operation, the voltage across the condenser 11 soon reaches zero and then exceeds the power supply voltage. This action allows the average voltage across the inductor 10 to be zero.

Therefore the present invention provides a means for obtaining a sawtooth voltage waveform with a minimum energy loss and therefore requires a minimum of energy from the source of electrical potential. Thus, once the source of electrical potential has charged the condenser 11, there would be no further need of the source if the inductors 10 and 14 were perfect inductances, if the resistor 15 and the resistance 26 were not present and if the switching device illustrated by the transistor 18 provided no resistive loss. Condenser 11 would be charged from the inductor 10 without loss and it would discharge through the inductor 14 without loss. In practice, both inductances must have a small resistance which will dissipate a certain amount of energy in the form of heat, and the transistor 18 has an internal resistance between its collector and emitter. These losses and the losses in the resistor 15 and the deflection coil resistance 26 are relatively small and it is only the energy so lost that must be replaced by the source across the terminals 12 and 13. The condenser 24 prevents the D.C. voltage from the source from producing a current flow through the deflection coil 23.

If the portion 31 of the condenser voltage waveform shown in FIGURE 2*a* were applied directly to the electromagnetic deflection coil 23, the retrace time would be slower than desirable. This occurs because of the inductance 25 in series with the resistance 26 of the yoke 23. During the trace period as illustrated by the plot portion 30, the voltage drop across the inductance 25 was small compared to the voltage drop across the resistance 26. During retrace, however, a rapid rate of current reversal is desired so that a much larger voltage appears across inductor 25. No such voltage pulse is available from the sawtooth waveform of FIGURE 2*a*. To reduce the retrace time the resistor 15 is in series with the inductance 14 and the transistor 18 across the condenser 11. The portion 32 of the transistor current plot, shown in FIGURE 2*b*, illustrates the current flow through the transistor 18 and the resistor 15 during the discharge of condenser 11 as illustrated by its plot portion 31. When the transistor 18 conducts, a voltage drop will appear across the resistor 15. Once the transistor starts to conduct, the voltage drop across both the diode 16 and the transistor 18 is sufficiently low that the voltage drop is negligible as shown by plot portion 33 in FIGURE 2*c*. The magnitude of the voltage drop across the resistor 15 is amplified by the transformer 20 to provide a sufficiently large pulse to the electromagnetic deflection coil 23 to cause it to rapidly retrace as shown by the portion 34 of the deflection coil voltage plot of FIGURE 2*d*. The peak current through the resistor 15 occurs when the condenser voltage is zero. At this point the retrace pulse across the deflection coil is at its maximum. The retrace pulse then decreases as shown by the portion 35 of FIGURE 2*d*. As soon as the transistor 18 ceases conduction as shown by the portion 36 of FIGURE 2*b*, the circuit through the inductance 14 and resistor 15 is open and the condenser 11 starts to recharge from the inductance 10 with the aid of the voltage source across the terminals 12 and 13. This produces the linear deflection as shown by the portion 37 of FIGURE 2*d*. Thus, the deflection coil is provided by a sawtooth sweep current followed by a rapid retrace pulse with a minimum energy loss in the circuit.

The combination of the resistor 15 and the transformer 20 have a second primary function in the embodiment of the invention shown in FIGURE 1. During the latter half of the deflection period the rate of voltage rise decreases across the condenser 11. This is caused by resistance losses in the circuit. The deflection coil contributes the largest relative resistance loss. The plots in FIGURES 2*a* and 2*d* have been drawn assuming the absence of such loss. If these losses are taken into account, the condenser voltage plot is modified as shown in FIGURE 6*a*. If the resistor 15 and the transformer 20 are removed from the circuit and the two leads of resistor 15 and the two leads of the secondary coil 22 joined together, the deflection coil voltage plot is modified as shown in FIGURE 6*b*. The dashed lines in FIGURES 6*a* and 6*b* are the plots of FIGURES 2*a* and 2*d* and are included to show the comparable non-linearity introduced by the resistive losses.

If a large inductor is added in series with the deflection coil 23, the non-linear sawtooth waveform of FIGURE 6*b* will be integrated to produce a parabolic waveform as shown in FIGURE 6*c*. When such a parabolic waveform is added to the non-linear sawtooth waveform of FIGURE 6*a*, an essentially linear sawtooth waveform is created as shown in FIGURE 2*d* and by dashed lines in FIGURE 6*b*. However, a sharp retrace pulse could not pass the large inductor unless a resistor is placed in parallel with the inductor. Thus, such a circuit as shown in FIGURE 5 with a large inductor 37 and a parallel resistor 38 would generate a linear sawtooth deflection waveform and be able to pass a sharp retrace pulse.

Those skilled in the art will recognize that the circuit of FIGURE 5 is equivalent to that of FIGURE 1. Therefore, the combination of resistor 15 and the transformer 20 in the circuit of FIGURE 1 not only provides a sharp retrace pulse, but also provides a passive device for correcting the non-linearity of the deflection waveform.

In addition, the wide angle deflection system requires further correction known as "S" correction to correct for the geometric distortion at the extreme deflection angles. An "S" shape may be achieved by slightly over-integrating. The value of condenser 11 is chosen at a somewhat smaller value. This results in the waveform shown in FIGURE 6*d*, which is both "S"-corrected and linearity-corrected.

The circuit formed by the combination of the resistor 15 and the transformer 20 must have a reasonable response in the region around a retrace resonant frequency which is governed by the values of the condenser 11 and the inductor 14. In addition, this circuit formed by the combination of resistor 15 and transformer 20 must have a frequency response characteristic below the retrace resonant frequency such that in the range between 10 and 100 cycles per second the amplitude of the output decreases as the frequency increases to provide the desired integration of the non-linear sawtooth waveform.

Since the function of the transistor 18 in FIGURE 1 is to provide a switching action when triggered by external triggering pulses and the function of the diode 16 is to protect the transistor against reverse current flow, and to sharply cut off such reverse current flow, other devices may be substituted for the transistor and the diode shown. For example, a diode might be placed in the base-emitter circuit of the transistor. A double base diode, a thyratron, a PNPN four layer diode, a controlled rectifier or a positive grid vacuum tube could be substituted to perform the switching function when triggered by external pulses. These are only a few of the various switching devices well known to those skilled in the art.

The embodiment of the invention shown in FIGURE 3 provides for a self-oscillating circuit and thereby does not require an external trigger pulse as is required by the embodiment shown in FIGURE 1 except for synchronism with other signals. The inductance 14 is now replaced by a resistor 130 which does require a larger energy loss in the condenser discharge portion of the circuit operation. The condenser 111 charges through the inductance 110 from the source of voltage connected across the terminals 112 and 113. The condenser 124 prevents the D.C. voltage of the source from producing a current flow through the deflection coil 123. The charging of the condenser 111 is shown by the plot portion 141 of the FIGURE 4*a*. The voltage change during this charging period of operation across the magnetic deflection coil 123 is shown in FIGURE 4*b* by the plot portion 142. When the voltage across the condenser 111 reaches approximately 130 percent of the source voltage across the terminals 112 and 113, the transistor 133 will "fire" and proceed to conduct as shown by the portion 143 of the transistor current plot shown in FIGURE 4*c*. As soon as the transistor starts to conduct the voltage across it becomes negligible and therefore the voltage across the electromagnetic deflection coil 123 drops to zero as shown by the plot portion 144 of FIGURE 4*b*. The voltage across the deflection coil 123 and condenser 124 remains zero as long as the transistor is conducting as shown by the plot portion 145. During this period of operation the voltage across the condenser 111 has returned to 70 percent of the source voltage value as shown by the plot portion 146 of FIGURE 4*a*. As soon as the transistor ceases conduction, the voltage across the coil 123 returns to that of the condenser 111 as shown by the plot portion 147 of FIGURE 4*b*. The plot portion 145 represents approximately 600 microseconds. This period is controlled by the blocking oscillator network composed of the transformer 135, resistor 137, condenser 138 and the resistor 139. The discharge time of the condenser 111 is primarily controlled by the time constant of the capacitance resistance circuit comprised of the condenser 111 and the resistor 130. Therefore this embodiment of the invention provides essentially the same desired waveform to the deflection coil as was provided for by the embodiment shown in FIGURE 1 but with the advantage of being self-oscillating and therefore requiring no additional circuits for triggering the switching means.

Referring now to FIGURE 7 which shows another modification of the present invention, a voltage source (not shown) is connected across the terminals 212 and 213. A combination transformer and inductor 210 has an autotransformer secondary 250 and is connected in series with a condenser 211 across the terminals 212 and 213. Therefore, these elements form a conventional inductance capacitance charging circuit. An inductor 214, a resistor 215, a diode 216, a collector 217 of a transistor 218 and an emitter 219 of the transistor 218 are connected in series across the condenser 211. A transformer 220 has a primary coil 221 conncted across the resistor 215. A secondary coil 222 of the transformer 220 is connected in series with a magnetic deflection coil 223 and a condenser 251 across a primary portion 252 of the inductor and transformer 210. The electromagnetic deflection coil 223 has an internal inductance 225 and an internal resistance 226. A base 227 of the transistor 218 is connected to a terminal 228. A terminal 229 is connected to the emitter 219 of the transistor 218. A source of negative pulses (not shown) is connected across the terminals 228 and 229 to drive the transistor 218.

It will be recognized that the modified version of the present invention shown in FIGURE 7 is similar to the embodiment shown in FIGURE 1 except that the deflection coil is no longer placed across the entire inductor. In the modified version shown in FIGURE 7, the deflection coil 223 is connected across only a portion of the inductor 210. This allows a proper impedance match to be made between the deflection coil 223 and the sawtooth generating circuit. Therefore, the voltage source connected across the terminals 212 and 213 can be of a higher voltage than is possible with the circuits shown in FIGURES 1, 3 and 5. Regardless of the voltage placed across the terminals 212 and 213, a proper impedance match may be made by choosing an inductor transformer 210 of appropriate value that can be tapped as shown in FIGURE 7.

In the circuits shown in FIGURES 1, 3 and 5 the non-linearity of the sawtooth waveform caused by resistive losses in the circuit was corrected by linearity-creating passive networks. In the circuit shown in FIGURE 7 the non-linearity is corrected by inserting a non-linear device in series with a yoke such that this non-linearity complements the non-linear driving waveform in a way that results in a linear deflection current. In this circuit the secondary coil 222 of a transformer 220 is shorted out during the latter half of the sweep. This action makes more of the sawtooth voltage available from the sawtooth waveform generator during the latter part of the trace which compensates for the drop due to the resistive losses.

A diode 253 is connected in series with a variable resistor 254 across the secondary coil 222 of the transformer 220 and a condenser 251.

During the retrace period, the secondary coil 222 of the transformer 220 receives a voltage pulse from the primary coil 221 produced by the voltage appearing across the resistor 215 as the condenser 211 discharges through the series of elements consisting of the resistor 215, the inductor 214, the diode 216 and the transistor 218. Voltages applied across the base 227 and the emitter 219 trigger the transistor into conduction. In this way the circuit shown in FIGURE 7 operates in the same manner as does the circuit in FIGURE 1. The voltage pulse received by the secondary coil 222, which is portion 260 of the secondary 222 voltage plot shown in FIGURE 8*b*, is impressed across the deflection coil 223 to produce a rapid retrace. Thus, a rapid retrace is created in the same manner in which it was created in the circuit of FIGURE 1. This voltage pulse has another function. It forces the diode 253 into conduction and thereby charges the condenser 251. The point at which the diode 253 begins to conduct is controlled by the variable resistor 254 in conjunction with the charge on condenser 251 and the D.C. voltage across the primary coil of transformer 210. At the end of the retrace period the voltage on the capacitor 251 blocks the diode and forces the current generated by the sawtooth waveform to go through the secondary of the transformer 220. As the voltage rises across the choke transformer secondary 250 as shown by the plot portion 261 of FIGURE 8*a*, the voltage will also rise across the series combination of the diode 253 and the resistor 254. At some point, depending upon the setting of the variable resistor 254, the charge remaining on condenser 251 and the D.C. voltage across the primary coil 252 of transformer 210, the diode 253 will commence to conduct current to short out the secondary coil 222. During the period the diode 253 is conducting to short out the secondary coil 222, more of the sawtooth voltage available from the sawtooth voltage waveform appearing across the inductor and transformer 210 and the condenser 211 as illustrated by plot portion 262 of FIGURE 8*a* is available to compensate for the drop due to resistive losses. Therefore, the latter part of the deflection coil voltage waveform shown as the portion 263 of the FIGURE 8*c* plot of the voltage appearing across diode 253 and resistor 254 is essentially linear. Thus, the linearity of the deflection coil waveform may be produced by one of two basic methods, either by the introduction of a passive integrating circuit or by inserting a compensating non-linear device in series with the deflection coil.

FIGURE 8*c* illustrates the linearity produced by having variable resistor 254 set for a large value of resistance. If resistor 254 is reduced to a small value, the voltage waveform will become much less linear as illustrated by FIGURE 8*d*.

I claim:

1. In an electromagnetic deflection circuit, the combination of a sawtooth voltage generator producing a non-linear sawtooth waveform including an inductance capacitance charging network, a capacitance inductance discharging network and a switching device for controlling said charging and said discharging networks, an electromagnetic deflection coil connected across a portion of said charging network, a non-linear device operatively connected with said deflection coil to produce an approximately linear sawtooth waveform from said non-linear waveform and a pulse voltage generating means producing a pulse voltage waveform operatively connected to said discharging network and coupled to said deflection coil.

2. In an electromagnetic deflection circuit, the combination of an inductance and a condenser connected in series with a source of electrical potential, a resistor and a self-oscillating switching means connected in series across said condenser, and an electromagnetic deflection coil connected across said switching means.

3. In an electromagnetic deflection circuit, the combination of a sawtooth voltage generator comprising a first inductance and a condenser connected in series across a source of electrical potential, a second inductance, a resistor, and a switching means for periodically discharging said condenser connected in series across said condenser, a pulse generating means comprising said resistor, a transformer with a primary and a secondary coil, said primary coil of said transformer connected in parallel with said resistor, said secondary coil and an electromagnetic deflection coil connected in series with said second inductance across said condenser.

4. In an electromagnetic deflection circuit, the combination of a sawtooth and pulse voltage generator comprising an inductance and a condenser connected in series across a source of electrical potential, a resistor and the emitter collector circuit of a transistor connected in series across said condenser, a blocking oscillator network connected with said transistor causing periodic conduction thereof, and an electromagnetic deflection coil connected across said collector and said emitter.

5. In an electromagnetic deflection circuit, the combination of a sawtooth voltage generator comprising a first inductor and a first condenser connected in series across a source of electrical potential, a resistor, a second inductor, and a switching means for periodically discharging said first condenser connected in series across said first condenser, a pulse generating means comprising said resistor, a transformer having a primary coil and a secondary coil, said primary coil connected in parallel with said resistor, said secondary coil, a second condenser, an electromagnetic deflection coil connected in series across a portion of said first inductor, a variable resistor, and a diode, said variable resistor and said diode being connected in series across said secondary coil of said transformer and said second condenser.

6. In an electromagnetic deflection circuit, the combination of a sawtooth voltage generator comprising a first inductance and a condenser connected in series across a source of electrical potential, a second inductance, a diode, a resistor, and a transistor connected in series across said condenser, said transistor being triggered to conduct periodically, a pulse generating means comprising said resistor, a transformer having a primary coil and a secondary coil, said primary coil connected in parallel with said resistor, said secondary coil and an electromagnetic deflection coil connected in series with said second inductance across said condenser.

7. In an electromagnetic deflection circuit, the combination of a sawtooth and pulse voltage generator comprising an inductance and a condenser connected in series across a source of electrical potential, a resistor, a transistor having an emitter-collector circuit connected in series across said condenser, a transformer having a primary and secondary coil, a blocking oscillator network having said primary coil connected across said resistor and said secondary coil connected operatively between said emitter and a base of said transistor, and an electromagnetic deflection coil connected across said collector and said emitter.

8. In an electromagnetic deflection circuit, the combination of a sawtooth voltage generator comprising a first inductor and a first condenser connected in series across a source of electrical potential; a resistor, a second inductor, a first diode, and a transistor connected in series across said first condenser, said transistor being triggered to conduct periodically, a pulse generating means comprising said resistor, a transformer having a primary coil and a secondary coil, said primary coil connected in parallel with said resistor, said secondary coil, a second condenser, and an electromagnetic deflection coil connected in series across a portion of said first inductor, a variable resistor, and a second diode, said variable resistor and said second diode being connected in series across said secondary coil of said transformer and said second condenser.

9. In an electromagnetic deflection circuit, the combination of a sawtooth voltage generator comprising a first inductance and a condenser connected in series across a source of electrical potential; a transistor with an emitter, a base, and a collector; a second inductor, a resistor, a diode, said collector of said transistor and an emitter of said transistor connected in series across said condenser; said transistor conducting whenever a trigger pulse is applied between said base and said emitter of said transistor, a pulse generating means comprising a resistor; a transformer having a primary coil and a secondary coil, said primary coil connected in parallel with said resistor, and said secondary coil and an electromagnetic deflection coil connected in series with said second inductance across said condenser.

10. In an electromagnetic deflection circuit, the combination of a sawtooth and pulse voltage generator comprising an inductance and a first condenser connected in series across a source of electrical potential, a transistor having a base, an emitter and a collector, a first resistor, said collector of said transistor and said emitter of said transistor connected in series across said first condenser; a transformer having a primary coil and a secondary coil, a blocking oscillator network having said primary coil connected across the said first resistor, said secondary coil connected in series with a second resistor and a paralleled second condenser and third resistor across said emitter and said base of said transistor and an electromagnetic deflection coil connected across said collector and said emitter.

11. In an electromagnetic deflection circuit, the combination of a sawtooth voltage generator comprising a first inductor and a first condenser connected in series across a source of electrical potential; a transistor having an emitter, a base, and a collector; a resistor, a second inductor, a first diode, said collector and said emitter of said transistor connected in series across said first condenser; said transistor conducting whenever a trigger pulse is applied between said base and said emitter of said transistor, a pulse generating means comprising said resistor; a transformer having a primary coil and a secondary coil, said primary coil connected in parallel with said resistor; a second condenser; an electromagnetic deflection coil connected in series with said second condenser and said secondary coil across a portion of said first inductor; a variable resistor; and a second diode, said variable resistor and said second diode being connected in series across said secondary coil of said transformer and said second condenser.

12. In an electromagnetic deflection circuit, the combination of a sawtooth voltage generator comprising first inductor and a first condenser connected in series with a source of electrical potential; the series combination of a second inductor, a switching means for periodically discharging said first condenser, and a pulse generating means for generating a pulse whenever said switching means discharges said first condenser, connected in parallel with said first condenser; an electromagnetic deflection coil connected in series with said pulse generating means across a portion of said first inductor; and a series combination of a variable resistor and diode connected operatively across said pulse generating means and with said deflection coil.

13. In an electromagnetic deflection circuit a linear sawtooth generator, comprising: a first inductance and a condenser connected in series across a source of electrical potential, a second inductance, a diode and a transistor connected in series across said condenser, said transistor being triggered to conduct periodically, a third inductor and an electromagnetic deflection coil connected in series therewith across the series combination of said diode and transistor, said third inductance integrating the sawtooth voltage developed across said condenser establishing a linear current through said deflection coil.

14. The deflection circuit of claim 13 including a resistor connected in parallel with said third inductance.

References Cited by the Examiner

UNITED STATES PATENTS

| | | | |
|---|---|---|---|
| 2,702,874 | 2/55 | Adler | 315—27 |
| 2,752,528 | 6/56 | Aires | 328—184 X |
| 2,851,632 | 9/58 | Janssen et al. | 315—27 |
| 2,896,115 | 7/59 | Guggi. | |
| 2,954,504 | 9/60 | Saudinaitis | 315—27 |
| 2,995,679 | 8/61 | Skoyles | 315—29 |
| 3,070,727 | 12/62 | Birt | 315—27 |
| 3,098,171 | 7/63 | Ashley | 315—27 |

OTHER REFERENCES

IRE Dictionary of Electronics Terms and Symbols. Institute of Radio Engineers, Inc., New York, 1961, pp. 102, 130.

DAVID G. REDINBAUGH, *Primary Examiner.*

RALPH G. NILSON, *Examiner.*